(12) United States Patent
Shearman et al.

(10) Patent No.: US 11,516,558 B2
(45) Date of Patent: Nov. 29, 2022

(54) ANGLED FACEPLATES FOR A NETWORK ELEMENT

(71) Applicant: Ciena Corporation, Hanover, MD (US)

(72) Inventors: Simon J. E. Shearman, Carleton Place (CA); Fabien Colton, Kars (CA); Daniel Rivaud, Ottawa (CA); Michael R. Bishop, Ottawa (CA)

(73) Assignee: Ciena Corporation, Hanover, MD (US)

( * ) Notice: Subject to any disclaimer, the term of this patent is extended or adjusted under 35 U.S.C. 154(b) by 279 days.

(21) Appl. No.: 17/016,669

(22) Filed: Sep. 10, 2020

(65) Prior Publication Data

US 2022/0078532 A1 Mar. 10, 2022

(51) Int. Cl.
| | |
|---|---|
| *H05K 7/14* | (2006.01) |
| *H04Q 1/02* | (2006.01) |
| *H04Q 1/06* | (2006.01) |
| *H05K 1/00* | (2006.01) |
| *H05K 1/18* | (2006.01) |
| *H05K 5/00* | (2006.01) |
| *H04Q 3/00* | (2006.01) |

(Continued)

(52) U.S. Cl.
CPC .............. *H04Q 1/09* (2013.01); *H04Q 1/025* (2013.01); *H04Q 1/035* (2013.01); *H04Q 1/066* (2013.01); *H04Q 3/0066* (2013.01); *H05K 1/00* (2013.01); *H05K 1/0209* (2013.01); *H05K 1/0284* (2013.01); *H05K 1/144* (2013.01); *H05K 1/181* (2013.01); *H05K 1/182* (2013.01); *H05K 5/00* (2013.01); *H05K 5/0026* (2013.01); *H05K 5/0213* (2013.01); *H05K 7/023* (2013.01); *H05K 7/1422* (2013.01); *H04Q 2213/13322* (2013.01); *H04Q 2213/13523* (2013.01); *H05K 2201/10189* (2013.01)

(58) Field of Classification Search
CPC .......... H05K 1/00; H05K 5/00; H05K 5/0026; H05K 7/023; H05K 7/1422
See application file for complete search history.

(56) References Cited

U.S. PATENT DOCUMENTS

| | | | |
|---|---|---|---|
| 6,104,611 | A | 8/2000 | Glover et al. |
| 6,376,779 | B1 | 4/2002 | Shearman et al. |

(Continued)

FOREIGN PATENT DOCUMENTS

WO 2019209522 A1 10/2019

OTHER PUBLICATIONS

Telcordia Technologies, Inc., NEBSTM Requirements: Physical Protection, (A Module of FD-NEBS-01 and FR-NEBS-EQUIP-PROTECT-01), Telcordia Technologies Generic Requirements, GR-63-CORE, Issue 4, Apr. 2012, pp. 1-186.

*Primary Examiner* — Sherman Ng
(74) *Attorney, Agent, or Firm* — Clements Bernard Baratta; Lawrence A. Baratta, Jr.; Christopher L. Bernard

(57) ABSTRACT

A module for a networking node is disclosed. The module includes a Printed Circuit Board ("PCB"), one or more circuits mounted to the PCB and a faceplate. The faceplate includes a middle plate, a first side plate, and a second side plate. The first side plate extends from the middle plate at an obtuse angle relative to the middle plate towards a first side and back of the module. The second side plate extends from the middle plate, opposite to the first side plate, at an obtuse angle relative to the middle plate towards a second side and the back of the module.

14 Claims, 18 Drawing Sheets

(51) Int. Cl.
    *H05K 1/02*     (2006.01)
    *H05K 1/14*     (2006.01)
    *H05K 7/02*     (2006.01)
    *H05K 5/02*     (2006.01)

(56) References Cited

U.S. PATENT DOCUMENTS

| | | | |
|---|---|---|---|
| 6,426,876 B1 | 7/2002 | Shearman et al. | |
| 6,466,724 B1 | 10/2002 | Glover et al. | |
| 6,512,679 B1 | 1/2003 | Shearman et al. | |
| 6,537,106 B1 * | 3/2003 | Follingstad | H04Q 1/09 439/534 |
| 6,545,850 B1 | 4/2003 | Shearman et al. | |
| 6,680,849 B2 | 1/2004 | Atkinson et al. | |
| 6,888,069 B1 | 5/2005 | Chen et al. | |
| 6,948,968 B1 | 9/2005 | Shearman et al. | |
| 7,035,111 B1 * | 4/2006 | Lin | G06F 1/184 361/748 |
| 7,042,716 B2 | 5/2006 | Shearman | |
| 7,043,130 B2 | 5/2006 | Ng et al. | |
| 7,145,773 B2 | 12/2006 | Shearman et al. | |
| 8,154,867 B2 | 4/2012 | Shearman et al. | |
| 9,492,914 B2 | 11/2016 | Ng et al. | |
| 9,603,289 B1 | 3/2017 | Shearman et al. | |
| 9,769,959 B2 | 9/2017 | Mayenburg et al. | |
| 9,820,403 B2 | 11/2017 | Shearman et al. | |
| 10,012,811 B2 | 7/2018 | Rivaud et al. | |
| 10,070,553 B2 | 9/2018 | Lee et al. | |
| 10,104,799 B2 | 10/2018 | Shearman et al. | |
| 10,247,895 B2 | 4/2019 | Rivaud et al. | |
| 10,425,360 B2 | 9/2019 | Estabrooks et al. | |
| 10,440,852 B1 | 10/2019 | Shearman et al. | |
| 10,674,241 B2 | 6/2020 | Rivaud et al. | |
| 2003/0103335 A1 * | 6/2003 | Skradde | G02B 6/428 361/733 |
| 2005/0074990 A1 | 4/2005 | Shearman et al. | |
| 2005/0075001 A1 | 4/2005 | Shearman et al. | |
| 2005/0233635 A1 * | 10/2005 | Denovich | H04Q 1/062 439/540.1 |
| 2005/0233647 A1 * | 10/2005 | Denovich | G02B 6/4452 439/719 |
| 2006/0045457 A1 | 3/2006 | Ng et al. | |
| 2007/0114056 A9 | 5/2007 | Cosman et al. | |
| 2011/0217009 A1 * | 9/2011 | Burrell | G02B 6/36 385/92 |
| 2012/0201001 A1 * | 8/2012 | Aoki | H05K 7/20727 361/690 |
| 2014/0002992 A1 * | 1/2014 | Claeys | H05K 7/1422 361/752 |
| 2016/0183402 A1 * | 6/2016 | Tamarkin | H04L 49/30 361/679.4 |
| 2019/0196127 A1 * | 6/2019 | Raven | G02B 6/4452 |
| 2019/0327126 A1 | 10/2019 | Rivaud et al. | |
| 2019/0327188 A1 | 10/2019 | Rivaud et al. | |

* cited by examiner

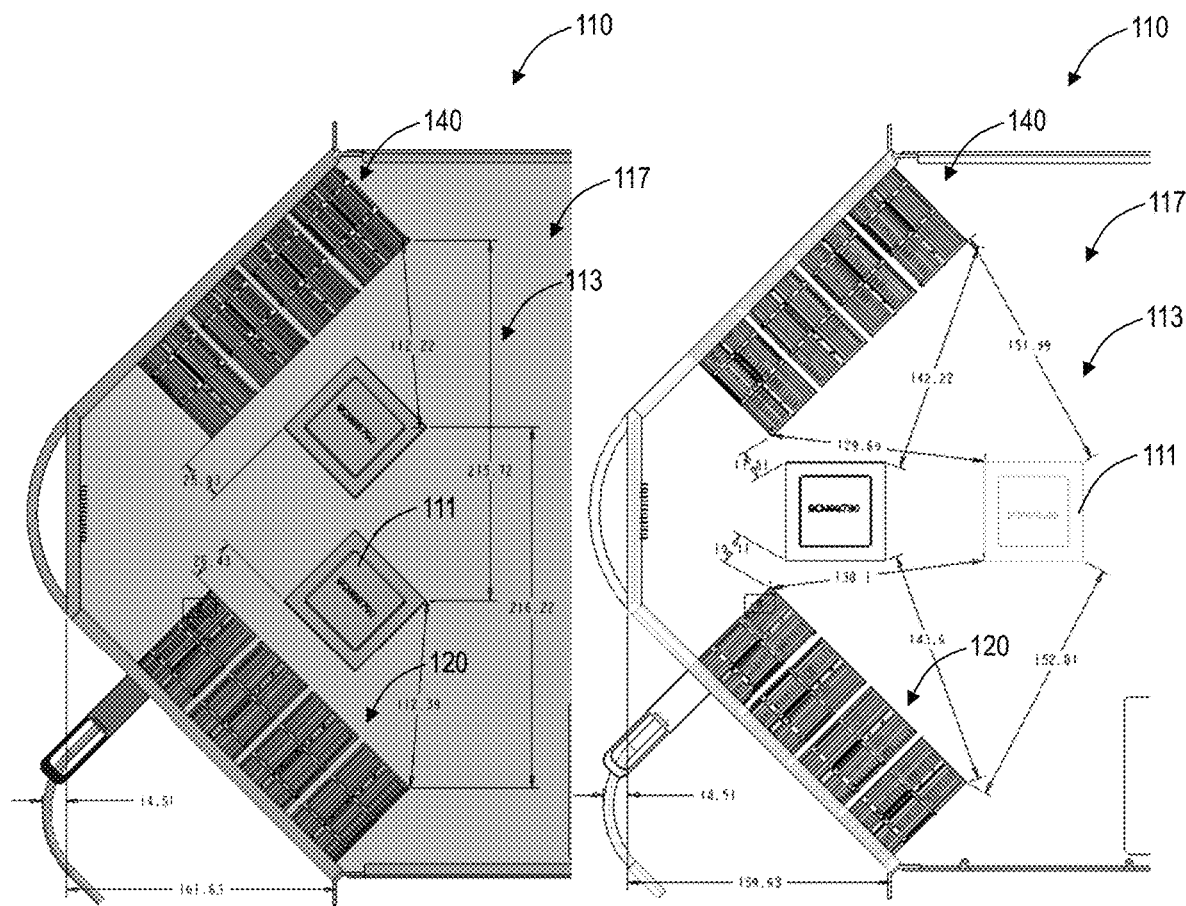
*FIG. 18*  *FIG. 19*

ANGLED FACEPLATES FOR A NETWORK ELEMENT

FIELD OF THE DISCLOSURE

The present disclosure generally relates to networking hardware. More particularly, the present disclosure relates to systems and methods for a network element having Angled Faceplates.

BACKGROUND OF THE DISCLOSURE

Networks, data centers, cloud computing, and the like continues to grow. Equipment manufacturers must continue to deliver substantial continuous reductions in per-bit metrics related to cost, space, and power. Telecommunication, data communication, high-performance computing, and the like systems are typically deployed in physical hardware shelves, chassis, rack-mounted units ("pizza boxes"), etc. that are mounted in racks or frames, freestanding, or the like. For example, typical racks or frames are either 19, 21, or 23 inches in practice. Various standards associated with racks or frames are described by Telecordia's GR-63-CORE, "NEBS Requirements: Physical Protection" (April 2012), European Telecoms Standards Institute (ETSI), American National Standard Institute (ANSI), etc. Physically, a node is referred to as a network element and can include a shelf or chassis with modules inserted therein, a rack-mounted unit ("pizza box"), and the like. Note, a shelf or chassis includes modules that are selectively inserted for functionality, whereas a rack-mounted unit is an integrated device. All such physical implementations are contemplated herein. All such implementations include a so-called faceplate that represents a front of the network element for accessing connections, ports, etc. The present disclosure utilizes the term module herein to refer to both a selectively insertable module in a chassis as well as a rack-mounted unit ("pizza box"). For a rack-mounted unit, the module may include the entire unit.

Current modules for network elements have flat faceplates that require long track lengths on the Printed Circuit Board ("PCB"), which often requires re-timers, do not provide physical and visual segregation of client and fabric ports, and require long cable lengths, which often result in the need for Active Electrical Cables ("AEC") instead of Direct Attach Copper ("DAC") cables. That is, flat faceplates cause longer track lengths on the PCB for ports or connections located at the edges of the flat faceplate, relative to ports or connections located in the middle of the flat faceplate.

BRIEF SUMMARY OF THE DISCLOSURE

In one embodiment, a module for a network node includes a Printed Circuit Board ("PCB"), one or more circuits mounted to the PCB and a faceplate. The faceplate includes a middle plate, a first side plate, and a second side plate. The first side plate extends from the middle plate at an obtuse angle relative to the middle plate towards a first side and back of the module. The second side plate extends from the middle plate, opposite to the first side plate, at an obtuse angle relative to the middle plate towards a second side and the back of the module. Of note, the angle of the faceplate is utilized to reduce track lengths on the PCB between ports on the first side plate and the second side plate, to support high-speed signals.

In embodiments, the faceplate further includes a plurality of physical ports in each of the first side plate, and the second side plate. In some embodiments, the faceplate further includes a plurality of physical ports in each of the middle plate, the first side plate, and the second side plate. The plurality of physical ports in the middle plate are one of fiber interface ports and client connection ports, and the plurality of physical ports in the first side plate and the second side plate are another of the fiber interface ports and the client connection ports.

In embodiments, the module further includes one or more circuits disposed on the PCB and associated track lengths on the PCB between the one or more circuits and the middle plate, the first side plate, and the second side plate.

In embodiments, the obtuse angle for each of the first side plate and the second side plate relative to the middle plate is from about 130 degrees to 160 degrees. The obtuse angle can be selected to reduce the associated track lengths between i) the first side plate and the one or more circuits and ii) the second side plate and the one or more circuits In embodiments, the middle portion includes a flat central portion including physical ports that is sunken into the module relative to inner ends of the first side plate and the second side plate, and the middle portion also includes stepped surfaces extending from the flat central portion respectively to the first side portion and the second side portion.

In another embodiment, a module for a network node includes a Printed Circuit Board ("PCB"), one or more circuits mounted to the PCB, and a faceplate. The faceplate is connected to the PCB and includes a middle plate, a first side plate, and a second side plate. The first side plate extends from the middle plate towards a first side and back of the module. The second side plate extends from the middle plate, opposite to the first side plate, towards a second side and the back of the module. The middle plate, the first side plate, and the second side plate form one of an acute trapezoidal shape and an acute trapezium shape, when considering the module as a whole.

In embodiments, the faceplate further includes a plurality of physical ports in each of the first side plate and the second side plate. In some embodiments, the faceplate further includes a plurality of physical ports in each of the middle plate, the first side plate, and the second side plate. The plurality of physical ports in the middle plate are one of fiber interface ports and client connection ports, and the plurality of physical ports in the first side plate and the second side plate are another of the fiber interface ports and the client connection ports.

In embodiments, an angle by which each of the first side plate and the second side plate extend from the middle plate is selected to reduce associated track lengths between i) the first side plate and the one or more circuits and ii) the second side plate and the one or more circuits.

In embodiments, an angle for each of the first side plate and the second side plate relative to the middle plate is from about 130 degrees to 160 degrees.

In embodiments, the middle portion includes a flat central portion including physical ports that is sunken into the module relative to inner ends of the first side plate and the second side plate, and the middle portion also includes stepped surfaces extending from the flat central portion respectively to the first side portion and the second side portion.

In a further embodiment, a node for a network includes a housing and a plurality of modules. The plurality of modules includes at least one module. The at least one module including a Printed Circuit Board ("PCB"), one or more circuits mounted to the PCB and a faceplate. The faceplate includes a middle plate, a first side plate, and a second side plate. The first side plate extends from the middle plate at an obtuse angle relative to the middle plate towards a first side and back of the module. The second side plate extends from the middle plate, opposite to the first side plate, at an obtuse angle relative to the middle plate towards a second side and the back of the module.

In embodiments, the faceplate further includes a plurality of physical ports in each of the first side plate, and the second side plate. In some embodiments, the faceplate further includes a plurality of physical ports in each of the middle plate, the first side plate, and the second side plate. The plurality of physical ports in the middle plate are one of fiber interface ports and client connection ports, and the plurality of physical ports in the first side plate and the second side plate are another of the fiber interface ports and the client connection ports.

In embodiments, the obtuse angle is selected to reduce the associated track lengths between i) the first side plate and the one or more circuits and ii) the second side plate and the one or more circuits. In embodiments, at least two modules of the plurality of modules have a different shape for their associated faceplate. In embodiments, a portion of surface area of each of the first side plate and the second side plate is utilized for ventilation.

In embodiments, at least two of the modules of the plurality of modules include the faceplate, and wherein at least one of a configuration of physical ports, a configuration of lengths of the middle plate, the first side plate, and the second side plate, and a configuration of an angle between the middle plate and the first side plate and an angle between the middle plate and the second side plate is different between the at least two of the modules.

BRIEF DESCRIPTION OF THE DRAWINGS

The present disclosure is illustrated and described herein with reference to the various drawings, in which like reference numbers are used to denote like system components/method steps, as appropriate, and in which:

FIG. 18 is a top perspective diagram of a module with multiple circuit placement on a PCB;

FIG. 19 is a p perspective diagram of a module with multiple circuit placement on a PCB that limits routing around circuits;

DETAILED DESCRIPTION OF THE DISCLOSURE

In various embodiments, the present disclosure relates to systems and methods for a network element, a node, etc. in a network with an arrangement of modules, such as packet slots, fabric slots, and universal slots. One or more of the modules includes an angled faceplate with one of a trapezoidal and a trapezium shape. The angled faceplate includes a middle plate, a first side plate, and a second side plate. The first side plate and the second side plate each extend from the middle plate at an obtuse angle, which forms the trapezoidal/trapezium shape (when considering the module as a whole). Note, while described as a middle plate, a first side plate, and a second side plate, these "plates" can be integrally formed and can be different portions of the angled faceplate.

The angled faceplate increases a surface area of the faceplate, resulting in more area for one or more of physical ports and cooling holes. Further, the angles of the first and second side plates allow for a shorter length of cables for pluggable optics plugged into the physical ports to be used. These shorter lengths can reduce the costs of installation, particularly when DAC cables can be used instead of AECs. Further, the angled first and second side plates result in the cages (that hold the pluggable optics) being situated closer to the one or more circuits. As such, track lengths (for the pluggable optics) from the cages to the one or more circuits are reduced. These reduced track lengths can reduce the manufacturing costs, particularly when the track lengths are short enough to reduce or remove the needs for re-timers on the PCB.

In embodiments, the types of physical ports used are separated on the different sections of the faceplate (middle plate, first side plate, second side plate), which provides visual and physical segregation of the pluggable optics in the faceplate. Again, of note, the angle of the faceplate is utilized to reduce track lengths on the PCB between ports on the first side plate and the second side plate, to support high-speed signals. That is, the shape, geometry, configuration, etc. of the faceplate described herein is based on the track lengths and ports on the face plates.

Figure 1:
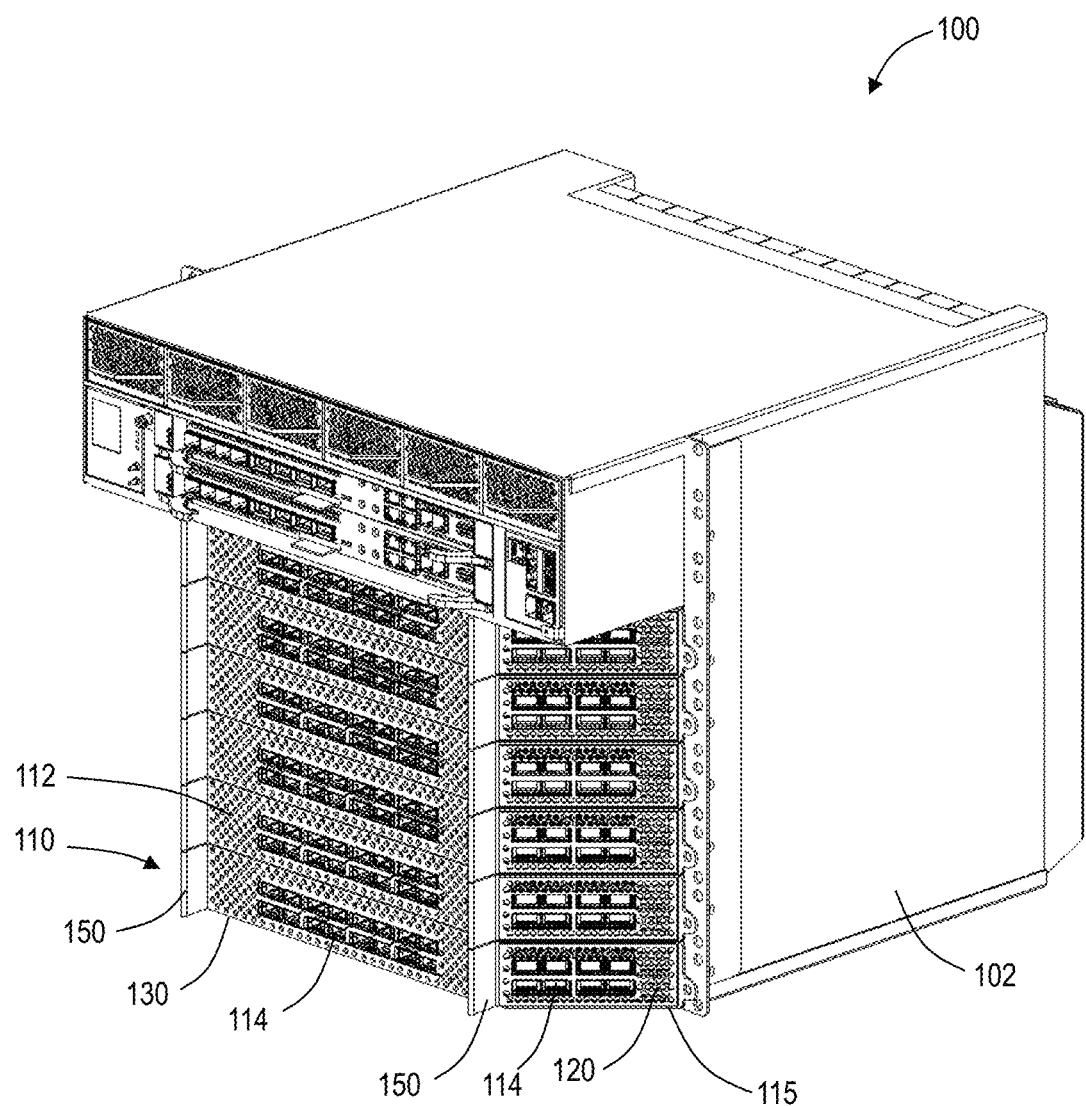
FIG. 1 is a perspective diagram of a network element arranged as a fabric system.
Figure 2:
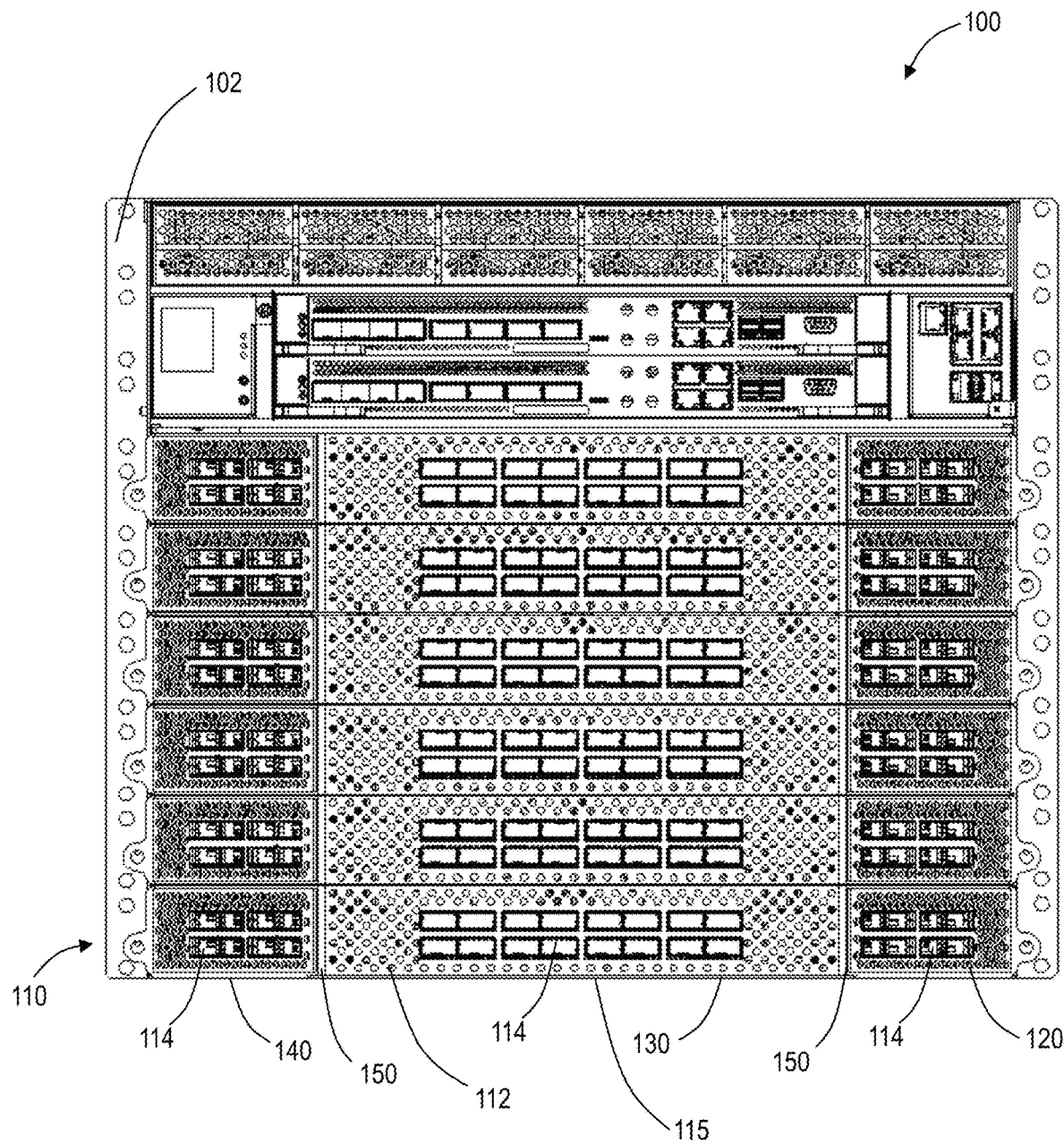
FIG. 2 is a front perspective diagram of the network element of FIG. 1.
Figure 3:
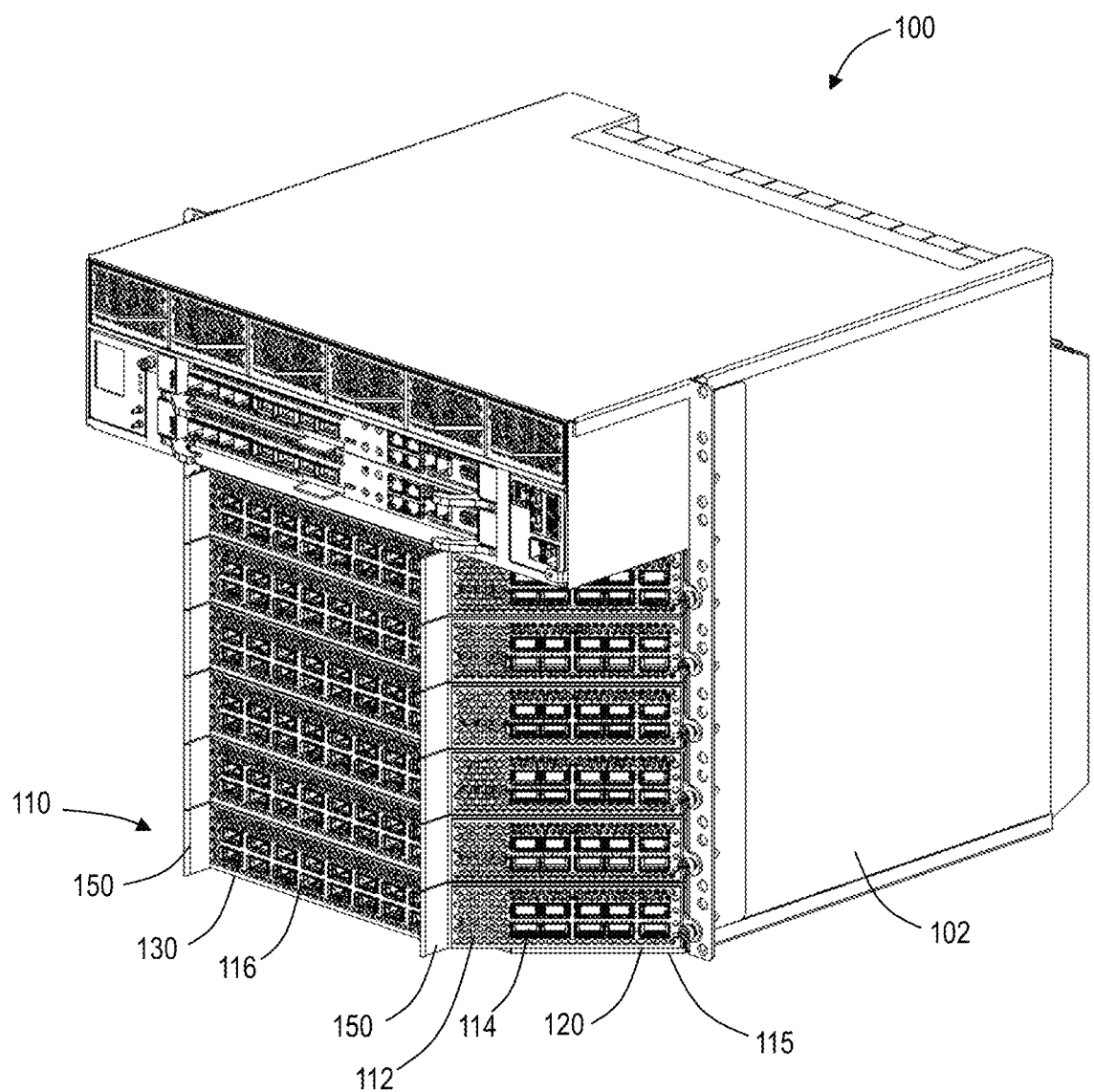
FIG. 3 is a perspective diagram of the network element arranged as a packet system.
Figure 4:
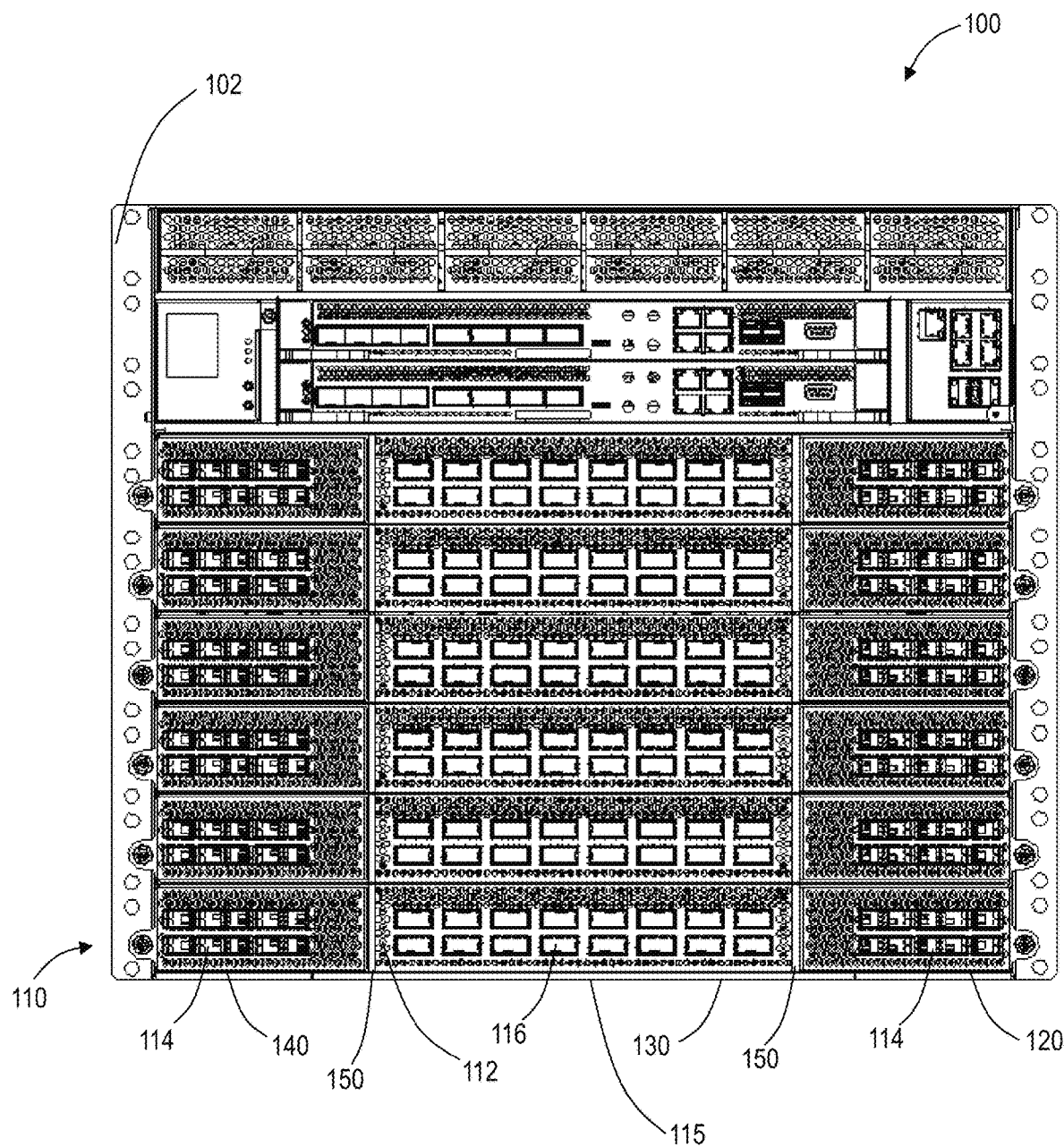
FIG. 4 is a front perspective diagram of the network element of FIG. 3.
Figure 5:
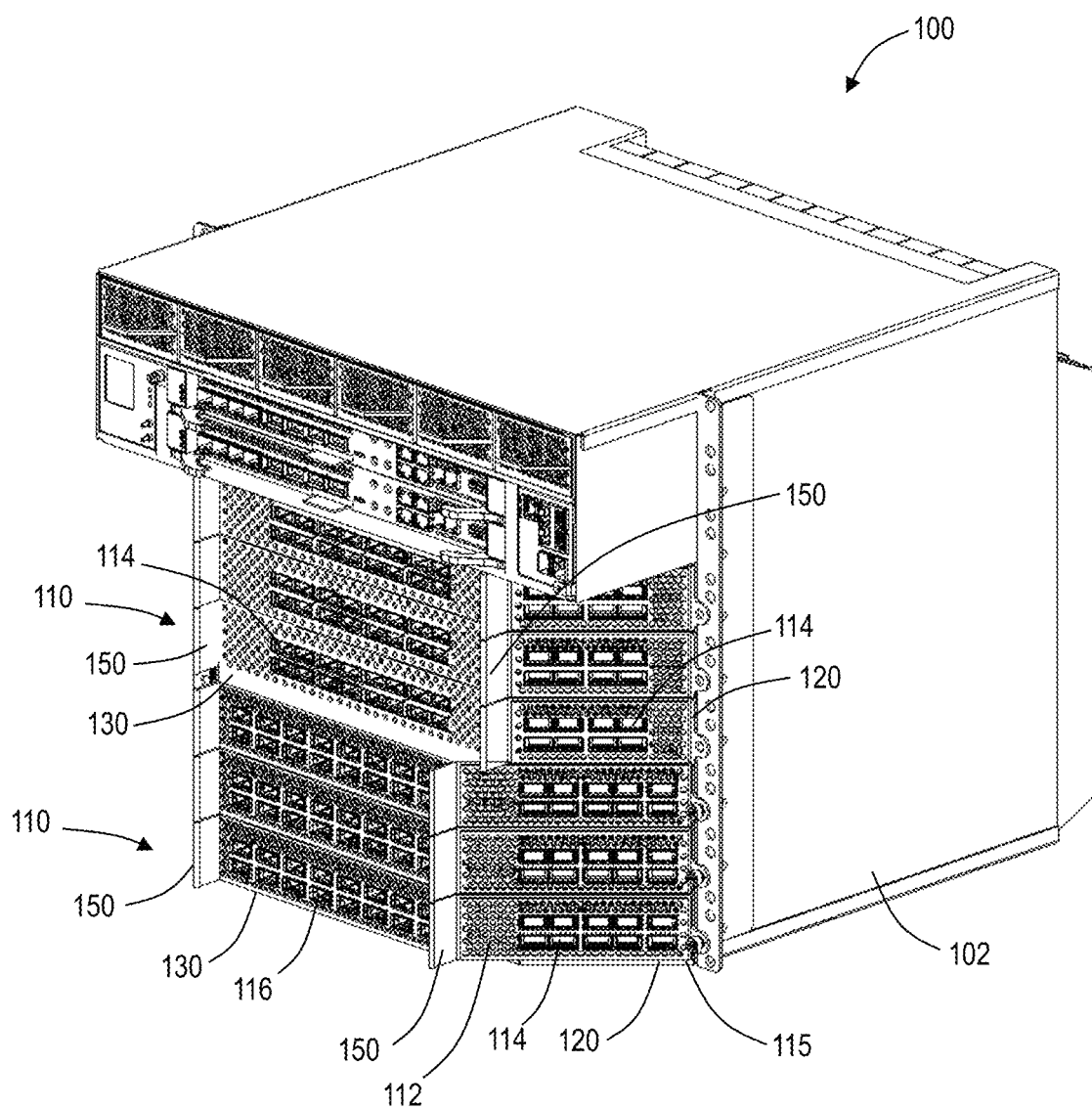
FIG. 5 is a perspective diagram of the network element arranged as a combination fabric and packet system.
Figure 6:
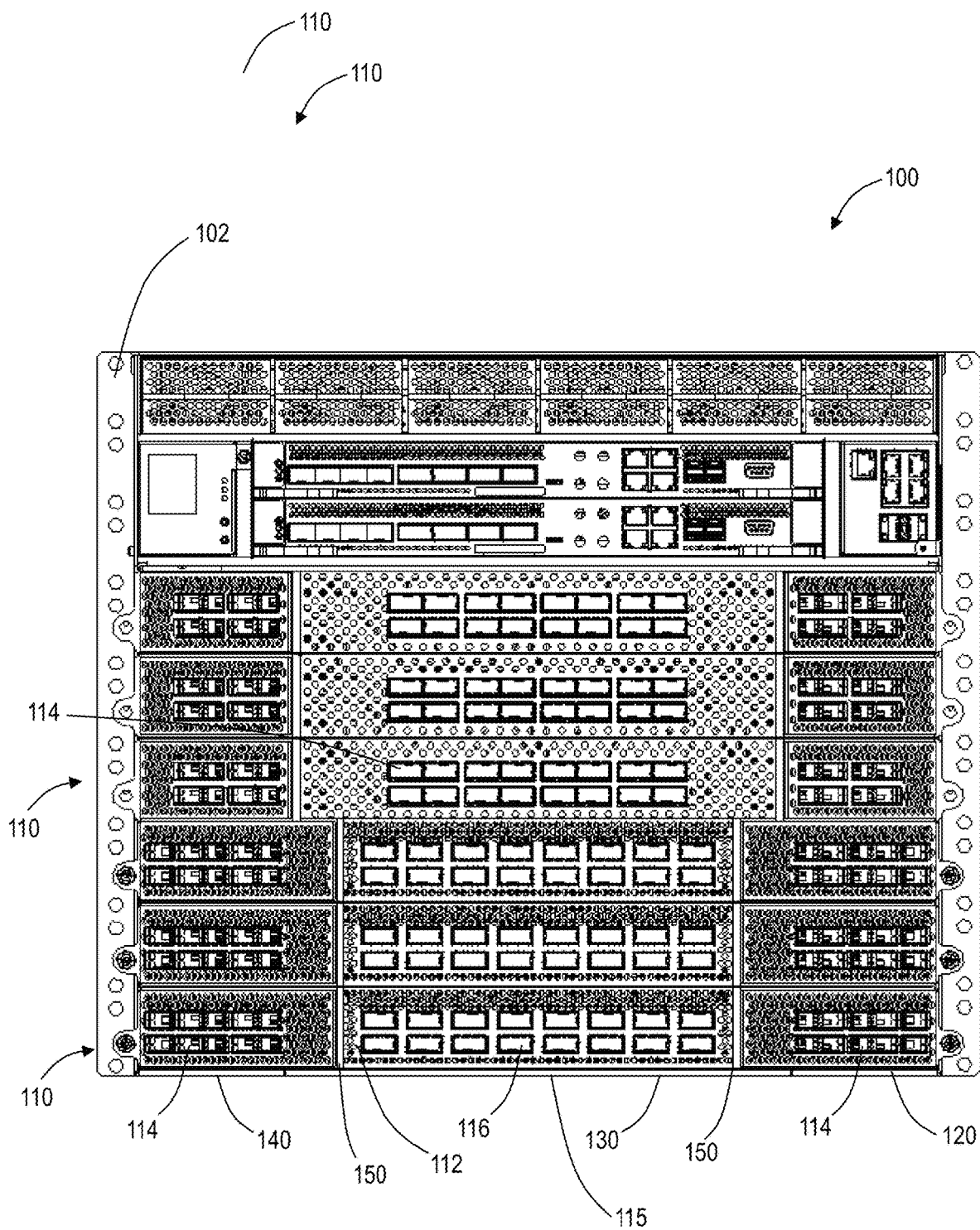
FIG. 6 is a front perspective diagram of the network element of FIG. 5.
Figure 7:
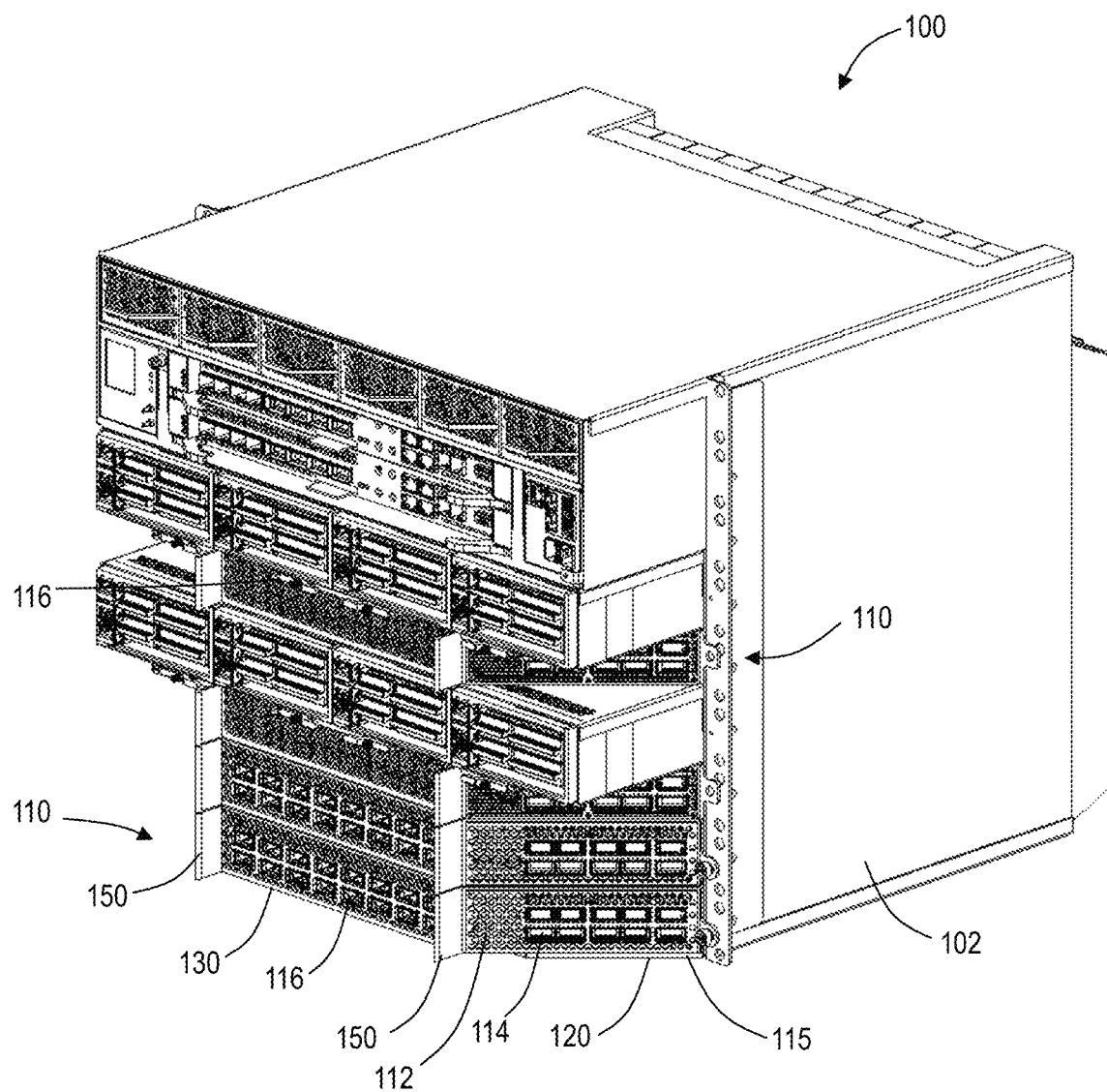
FIG. 7 is a perspective diagram of the network element arranged as a packet and universal system.
Figure 8:
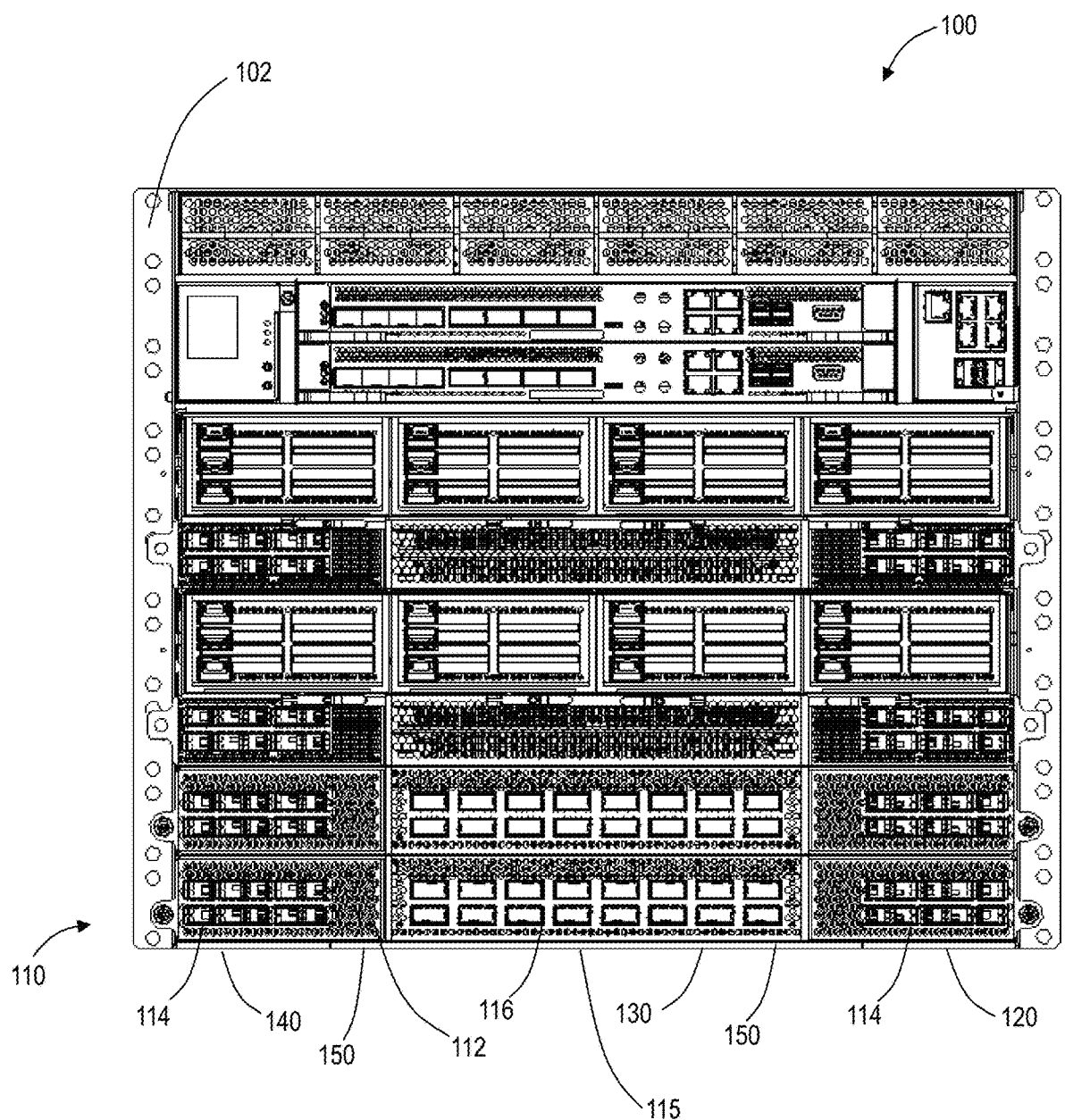
FIG. 8 is a front perspective diagram of the network element of FIG. 8.

FIG. 1 is a perspective diagram of the network element arranged as a fabric system. FIG. 2 is a front perspective diagram of the network element of FIG. 1. FIG. 3 is a perspective diagram of the network element arranged as a packet system. FIG. 4 is a front perspective diagram of the network element of FIG. 3. FIG. 5 is a perspective diagram of the network element arranged as a combination fabric and packet system. FIG. 6 is a front perspective diagram of the network element of FIG. 5. FIG. 7 is a perspective diagram of the network element arranged as a packet and universal system. FIG. 8 is a front perspective diagram of the network element of FIG. 8. Referring generally to FIGS. 1-8, the network element 100 can be a shelf, a system, etc. forming a node, etc. in a network. The network element 100 can be a full-rack or a half-rack system or even a couple Rack Units (RU) high, such as a pizza box. The network element 100 is presented as an example for illustration purposes. Those skilled in the art will recognize other physical embodiments are contemplated. That is, the present disclosure contemplates use with any hardware platform for a network element. The present disclosure utilizes the term module herein to refer to both a selectively insertable module in a chassis as well as a rack-mounted unit ("pizza box").

In an embodiment, the network element 100 is a network element that consolidates the functionality of a Multi-Service Provisioning Platform (MSPP), Digital Cross-Connect (DCS), Ethernet and/or Optical Transport Network (OTN) switch, Dense Wave Division Multiplexing (DWDM) platform, etc. into a single, high-capacity intelligent switching system providing Layer 0, 1, and 2 consolidation. In another exemplary embodiment, the network element 100 is any of an OTN Add/Drop Multiplexer (ADM), a SONET/SDH/OTN ADM, an MSPP, a DCS, an optical cross-connect, an optical switch, a router, a switch, a DWDM terminal, wireless backhaul terminal, an access/aggregation device, etc. That is, the network element 100 is any digital and/or optical system with ingress and egress signals and switching therebetween of channels, timeslots, tributary units, packets, etc. utilizing OTN, SONET, SDH, Ethernet, IP, etc. In another embodiment, the network element 100 is a high-rate Ethernet switch. In a further embodiment, the network element 100 is a DWDM terminal. In yet another embodiment, the network element 100 is a compute, wireless, storage, or other type of hardware platform.

The network element 100 includes a housing 102 which can refer to any shelf, rack, cabinet, case, frame, chassis, or other apparatus used to arrange and/or support a plurality of modules 110 that are electronic/optical components such as removable cards, rack-mounted units, including leaf-spine pizza boxes and chassis modules, and the like.

The housing 102 may be metal, plastic, or combination, or other suitable material and similar in construction to other housings, cabinets and/or racks used to hold electronic/optical components in place. Further, the housing 102 may be rack mounted in an ETSI, ANSI, etc. compliant rack or frame, as well as being deployed in a cabinet, etc. The housing 102 includes a front where the modules 110 are received, sides adjacent thereto, and a back. The sides can be parallel to one another, while the back is oriented perpendicular to the sides.

Figure 9:
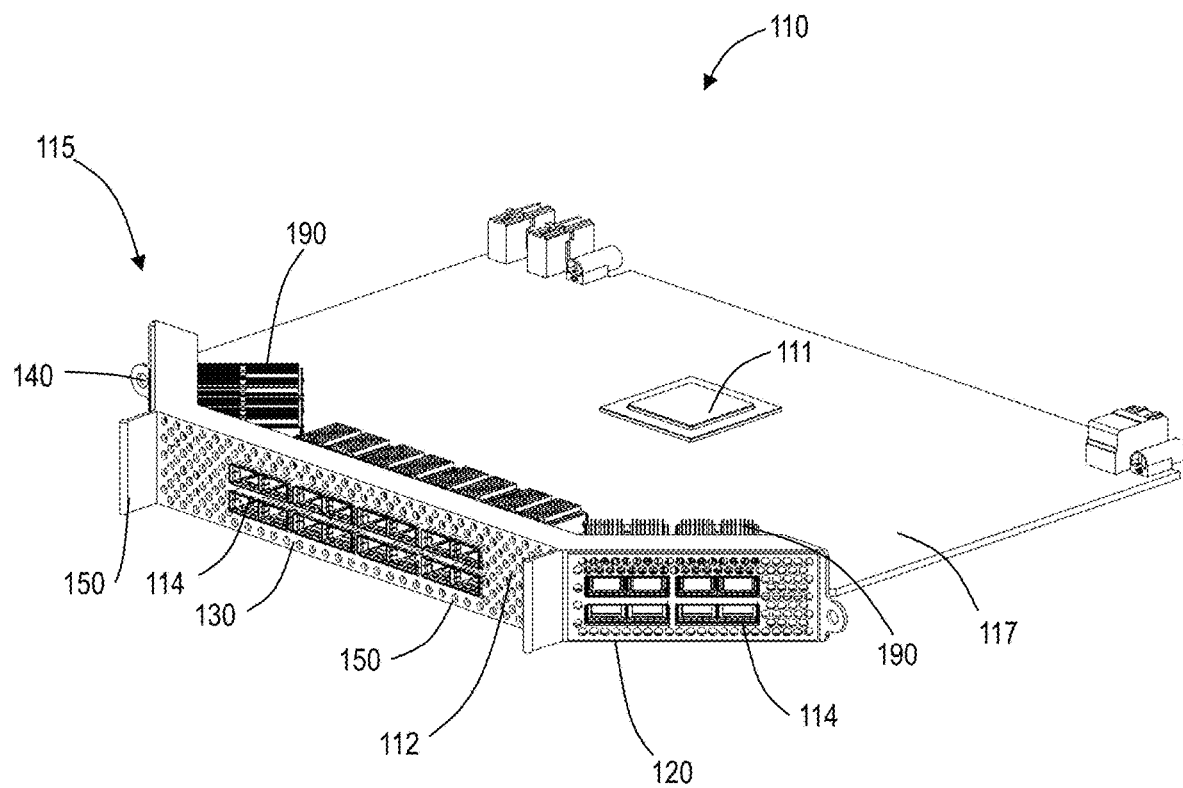
FIG. 9 is a perspective diagram of an embodiment of a network element module arranged for fabric interconnects for the network elements of FIGS. 1, 2, 5, and 6.
Figure 10A:
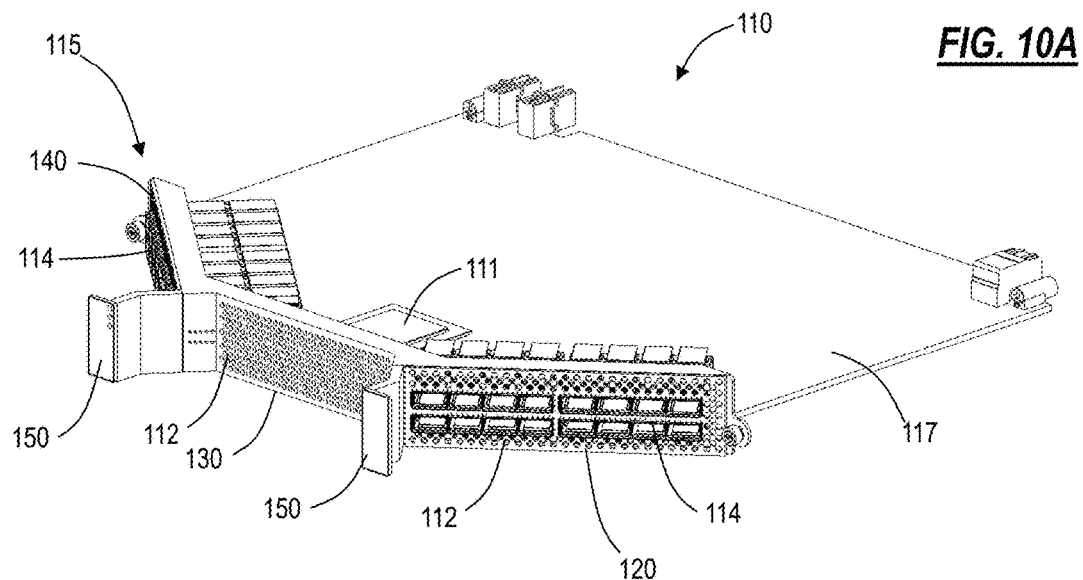
FIG. 10A is a perspective diagram and FIG. 10B is a top perspective diagram of another embodiment of a network element module arranged for fabric interconnects for the network elements of FIGS. 1, 2, 5, and 6.
Figure 10B:
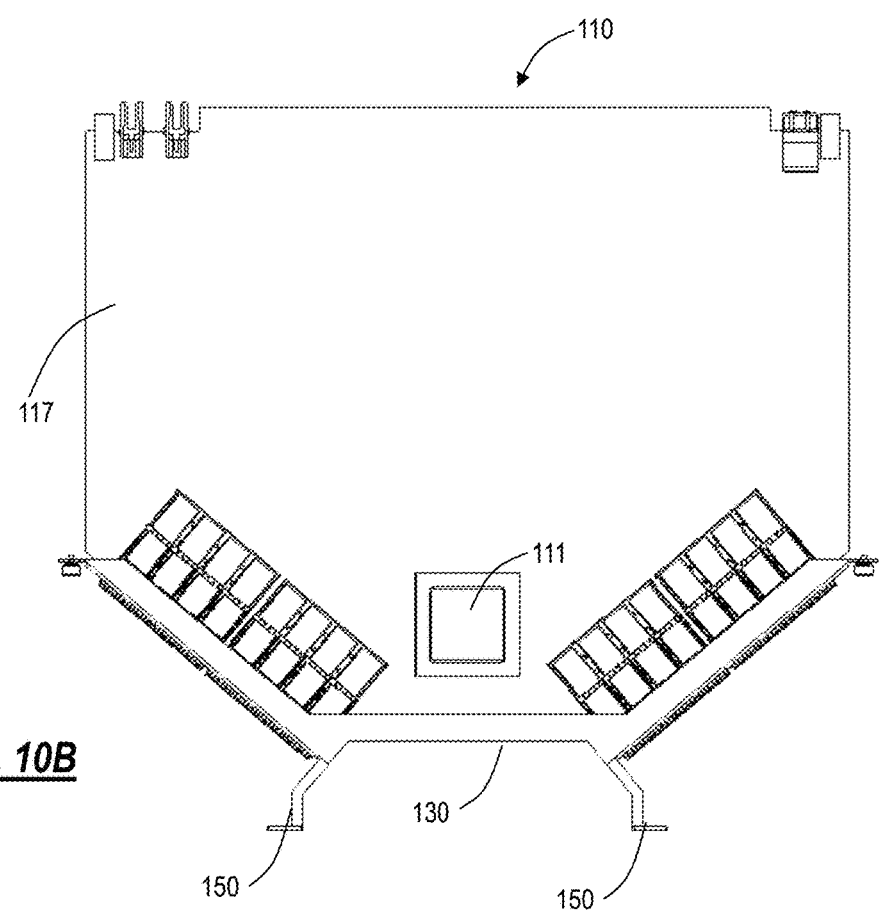
Figure 11:
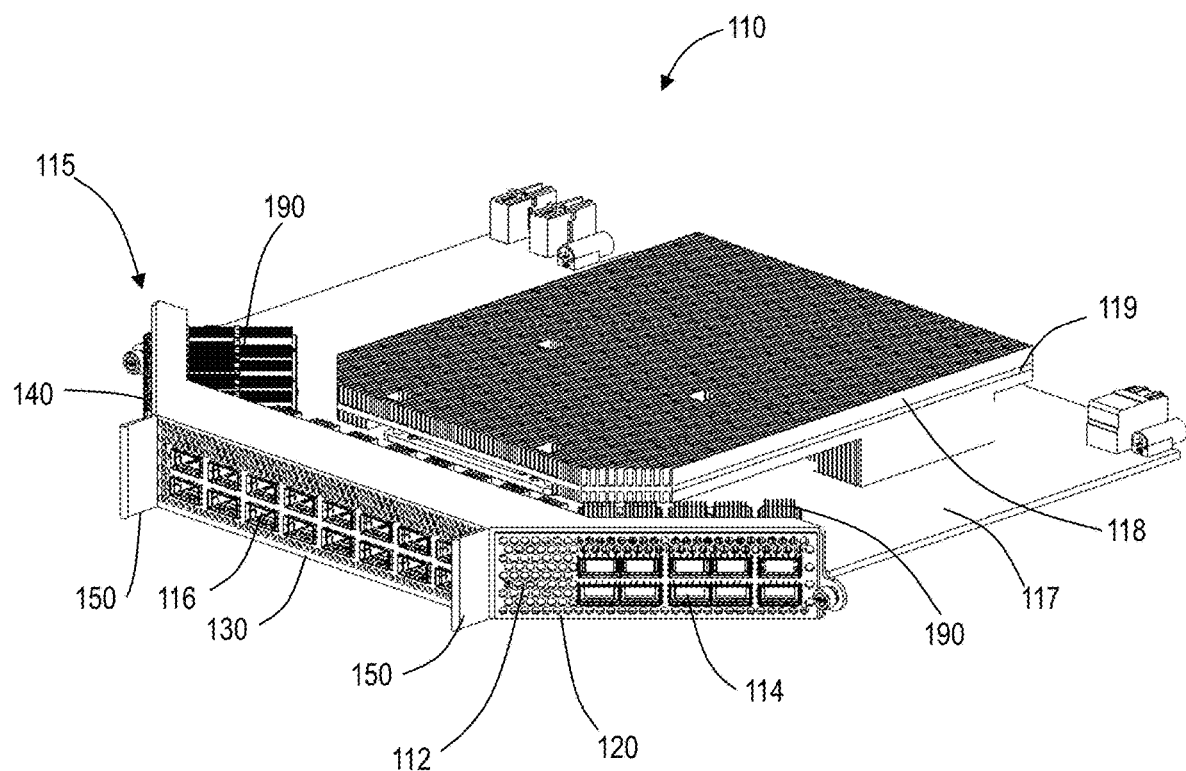
FIG. 11 is a perspective diagram of a module arranged for both fabric interconnects and client connections for the network element of FIGS. 3-8.
Figure 12:
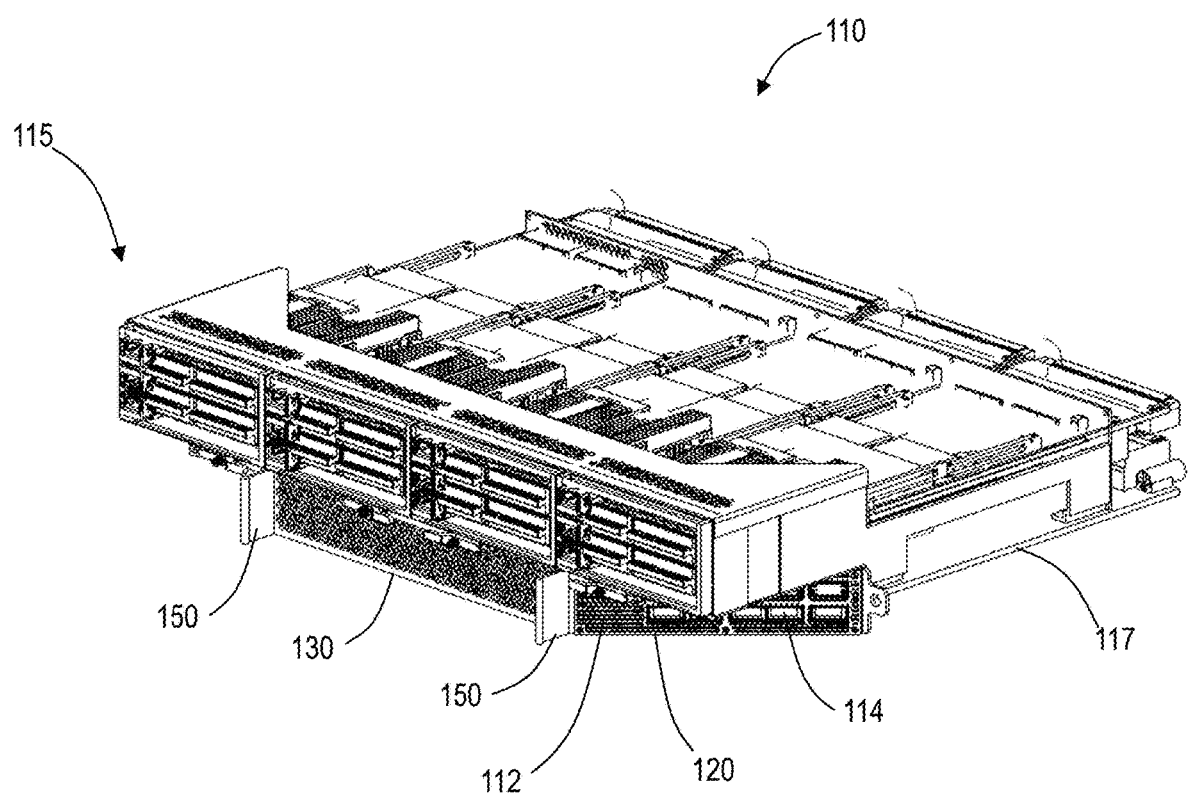
FIG. 12 is a perspective diagram of a module arranged for both fabric interconnects and client connections for the platform of FIGS. 7 and 8.

The plurality of modules 110 include one or more of a fabric slot (refer to FIGS. 1, 2, 5, and 6), a packet slot (refer to FIGS. 3-8), a universal slot (refer to FIGS. 7 and 8), and the like. As can be seen in FIGS. 1-8, any combination of modules 110 can be used in the network element 100. FIG. 9 is a perspective diagram of an embodiment of a module 110 arranged for fabric interconnects for the network elements of FIGS. 1, 2, 5, and 6. FIG. 10A is a perspective diagram and FIG. 10B is a top perspective diagram of another embodiment of a network element module 110 arranged for fabric interconnects for the network elements of FIGS. 1, 2, 5, and 6. In the embodiments illustrated in FIGS. 9 and 10, the module 110 is a fabric slot. FIG. 11 is a perspective diagram of a module 110 arranged for both fabric interconnects and client connections for the network elements of FIGS. 3-8. In the embodiment illustrated in FIG. 11, the platform module 110 is a packet slot. FIG. 12 is a perspective diagram of a module arranged for both fabric interconnects and client connections for the network element of FIGS. 7 and 8. In the embodiment illustrated in FIG. 12, the module 110 is a universal slot, such as for a pluggable module that includes other functions besides optical connectivity.

Referring generally to FIGS. 1-12, modules 110 are adapted to receive pluggable optical transceivers selectively (can also be called pluggable electro-optical transceivers. Again, the modules 110 can be referred to as interface cards, line cards, line blades, I/O modules, etc. and can be adapted to receive a plurality of optical modules in the front. For example, the optical modules can be pluggable modules such as, without limitation, XFP, SFP, XENPAK, X2, CFP, CFP2, CFP4, QSFP, QSFP+, QSFP28, OSFP, QSFP-DD, etc.). Further, the modules 110 can include a plurality of optical connections per module. The modules 110 can include wavelength division multiplexing interfaces, short-reach interfaces, and the like, and can connect to other modules 110 on remote network elements, end clients, edge routers, and the like.

From a logical perspective, the modules 110 provide ingress and egress ports to the network element 100, and each module 110 can include one or more physical ports 114 and 116. The fabric slots are configured to switch channels, timeslots, tributary units, packets, cells, etc. between the fabric and universal slots.

Each of the modules 110 includes a faceplate 115 with physical ports 114, 116 therein. The physical ports 114, 116 can be fiber interface ports 114, client connection ports 116, and the like. Cages 190 are connected to the faceplate 115 and are adapted to receive pluggable optics via the physical ports 114, 116.

The faceplate 115 includes a first side plate 120, a middle plate 130, and a second side plate 140. Each of the first side plate 120, the middle plate 130, and the second side plate 140 being positioned at the front of the network element 100. Referring to FIGS. 9-12, each of the first side plate 120 and the second side plate 140 extend from the middle plate 130 at an obtuse angle, such that each of the first side plate 120 and the second side plate 140 extends toward a respective side and towards a back of the module 110 from the middle plate 130 (i.e., the first side plate 120 and the second side plate 140 each slopes away from the middle plate 130). In view of the obtuse angles between the middle plate 130 and the first and second side plates 120, 140, in embodiments the faceplate 115 generally includes one of an acute trapezoidal shape and an acute trapezium shape when viewed from above where the base is formed by connecting the distal ends of the first and second side plates 120, 140. In embodiments, the first and second side plates 120, 140 are symmetrical, and the faceplate 115 generally includes an isosceles trapezoidal shape. In these embodiments, the middle pate 130 is parallel to the back of the module 110 and to the back of the network element 100, the back of each being opposite the middle pate 130.

In embodiments, each of the angles between the first side plate 120 and the middle plate 130 and the angle between the second side plate 140 and the middle plate 130 is from about 130 degrees to 160 degrees. In the embodiment illustrated, each of the angles between the first side plate 120 and the middle plate 130 and the angle between the second side plate 140 and the middle plate 130 is about 130 degrees while the first and second plates 120 and 140 are at an about 45-degree angle relative to the front of network element 100. In some embodiments, each of the angles between the first side plate 120 and the middle plate 130 and the angle between the second side plate 140 and the middle plate 130 is about 160 degrees while the first and second plates 120 and 140 are at an about 30-degree angle relative to the front of network element 100. Other angles and configurations between the multiple plates 120, 130, 140 of the faceplate 115 are also contemplated.

In some embodiments, each section of the faceplate 115, including the first side plate 120, the middle plate 130, and the second side plate 140 includes physical ports 114, 116. In the module 110 of FIG. 9, each of the first side plate 120, the middle plate 130 includes fiber interface ports 114. In the module 110 of FIG. 11, the first side plate 120 and the second side plate 140 each include fiber interface ports 114, while the middle plate 130 includes client connection ports 116. While the fiber interface ports 114 are shown on the first and second side plates 120, 140, in other embodiments, the orientation is switched, with the middle plate 140 including the fiber interface ports 114 and the middle plate 130 including the client connection ports 116. By separating the types of physical ports 114, 116 by the different plates on the faceplate 115, both visual and physical segregation of physical ports 114, 116, such as the separation of fiber interface ports 114 from client connection ports 116 is easily obtained. In the embodiment illustrated, the cages 190 aligned with the physical ports 114, 116 each extend perpendicular to the corresponding plate 120, 130, 140 that the cages 190 are connected to.

Other configurations are also contemplated. Indeed, in some embodiments, only the first side plate 120 and the second side plate 140 include physical ports 114, 116, while the middle plate 130 does not include any physical ports 114 and 116. In the embodiment illustrated in FIGS. 10A and 10B, the module 110 is a fabric slot, and each of the first side plate 120 and the second side plate 140 include fiber interface ports 114. The middle plate 130 includes cooling holes 112 to provide further cooling for the module 110, i.e., ventilation.

In some embodiments, the physical ports are adapted to receive a pluggable module, such as a control module, universal sub-slot module, and the like. In embodiments, these pluggable modules include angled faceplates when adapted to be received in one of the first and second side plates 120, 140, such that the face of the pluggable module is flush with the corresponding first or second side plate 120, 140. In embodiments, the pluggable module includes a right trapezoidal shape to be flush with the corresponding first or second side plate 120, 140.

Each module 110 also includes a PCB 117, one or more circuits 111, 118, and cages 190. In the embodiment illustrated in FIGS. 10A and 10B, the one or more circuits includes an Application-Specific Integrated Circuits (ASICs) with a heat sink 119. The faceplate 115 is connected to a front edge of the PCB 117, and the one or more circuits 111, 118 is mounted on and electrically connected to the PCB 117. The cages 190 are adapted for physical connection thereto and can include a heat exchanger, such as a heat sink or cold plate, for maintaining a temperature of the pluggable optics. The circuits 111, 118 perform some functionality and connect to the cages 190.

In embodiments, the fins of the heat sinks on the cages for cooling the pluggable optics are angled perpendicular to the middle plate 130, such that the fins on the cages 190 connected to the first side plate 120 and the second side plate 140 are angled relative to the cages 190, such as between 30 to 45 degrees relative to sides of the cages 190. In these embodiments, the airflow is configured to flow in a front to back direction. In some embodiments, the top and bottom edges of the faceplate 115 are beveled to provide further surface area for the cooling holes 112 to enable ventilation.

In some embodiments, a radiator is positioned in each of the wedge-shaped spaces between the cages 190 adjacent to the intersections between the middle plate 130 and the first and second side plates 120, 140. In these embodiments, the PCB 117 does not extend into the wedge-shaped space.

In embodiments, each of the multiple plates 120, 130, 140 (first side plate 120, middle plate 130, and second side plate 140) includes cooling holes 112 extending therethrough that allow air to pass through for cooling of the pluggable optics and the one or more circuits.

In some embodiments, the module 110 includes one or more handles 150 protruding from the faceplate 115. In the embodiments illustrated in FIGS. 1-12, the handles 150 are tabs extending from the faceplate 115 at or adjacent to the intersections between the middle plate 130 and the first and second side plates 120, 140. The handles 150 are adapted for pulling/pushing the modules 110 into/out of the housing 102. In some embodiments, the handles 150 are also adapted to receive labels for the module 110. Other low-profile components can also be positioned at or adjacent to the intersections between the middle plate 130 and the first and second side plates 120, 140, such as further labels, LCDs, and the like.

Due to the configuration of the angled faceplate 115, there is more surface area for the physical ports 114, 116, cooling holes 112, handles 150, and the other low-profile components. The increased surface area for cooling holes 112 can allow more cooling air to be passed through the faceplate 110 for cooling the pluggable optics and the one or more circuits 111, 118.

As can be seen in FIG. 5, a length of the multiple plates 120, 130, 140 can vary to accommodate different amounts of physical ports 114, 116 and different configurations for the cooling holes 112. Thus, configurations with longer first and second side plates 120, 140 have middle plates 130 that protrude further than those with shorter first and second side plates 120, 140. In embodiments, such as the embodiment shown in FIG. 5, modules with different lengths of the multiple plates 120, 130, 140 and with different angles therebetween can be included in a single network element 100.

Figure 13:
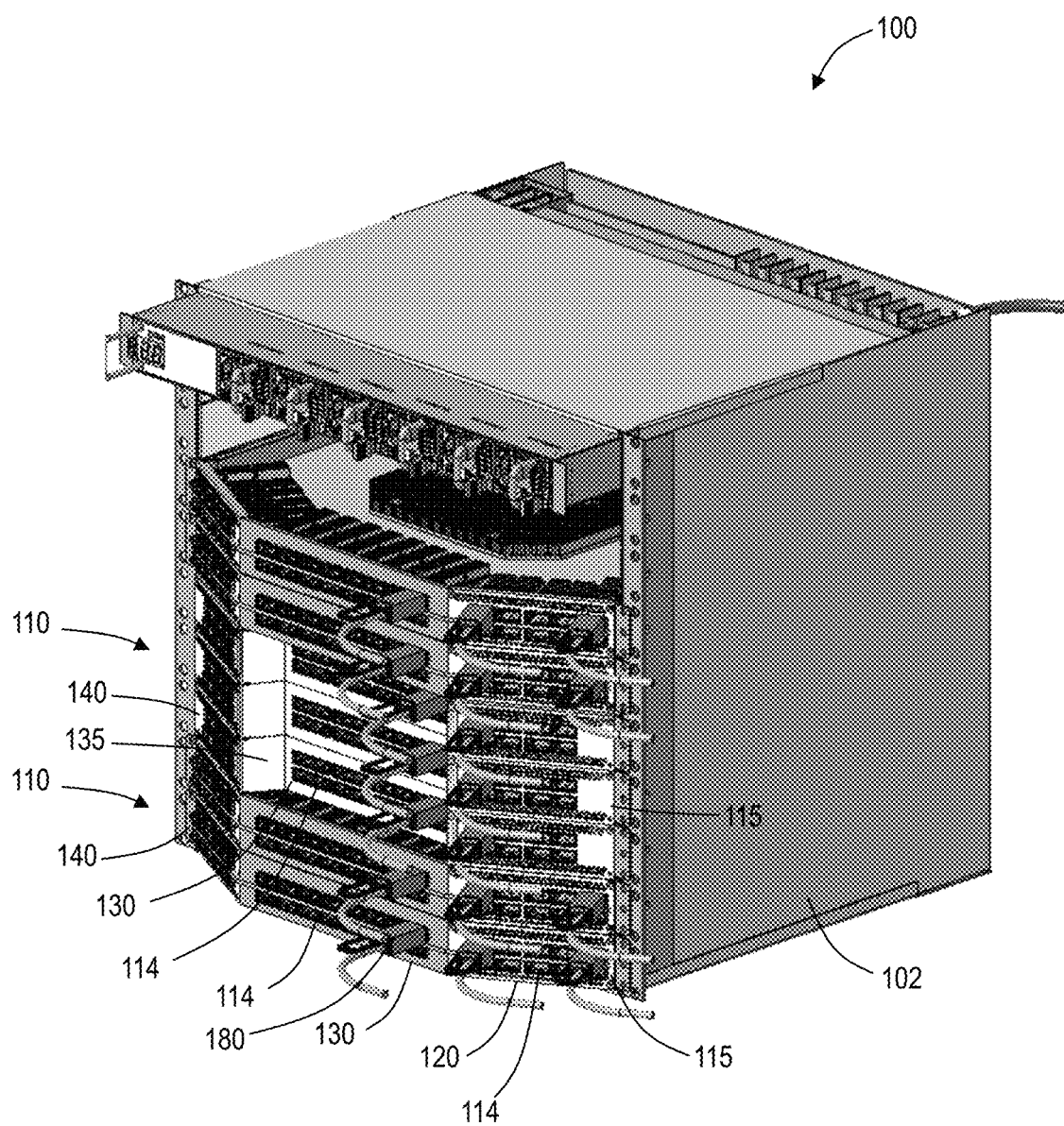
FIG. 13 is a perspective diagram of the network element of FIG. 5 with a sunken middle plate.
Figure 14:
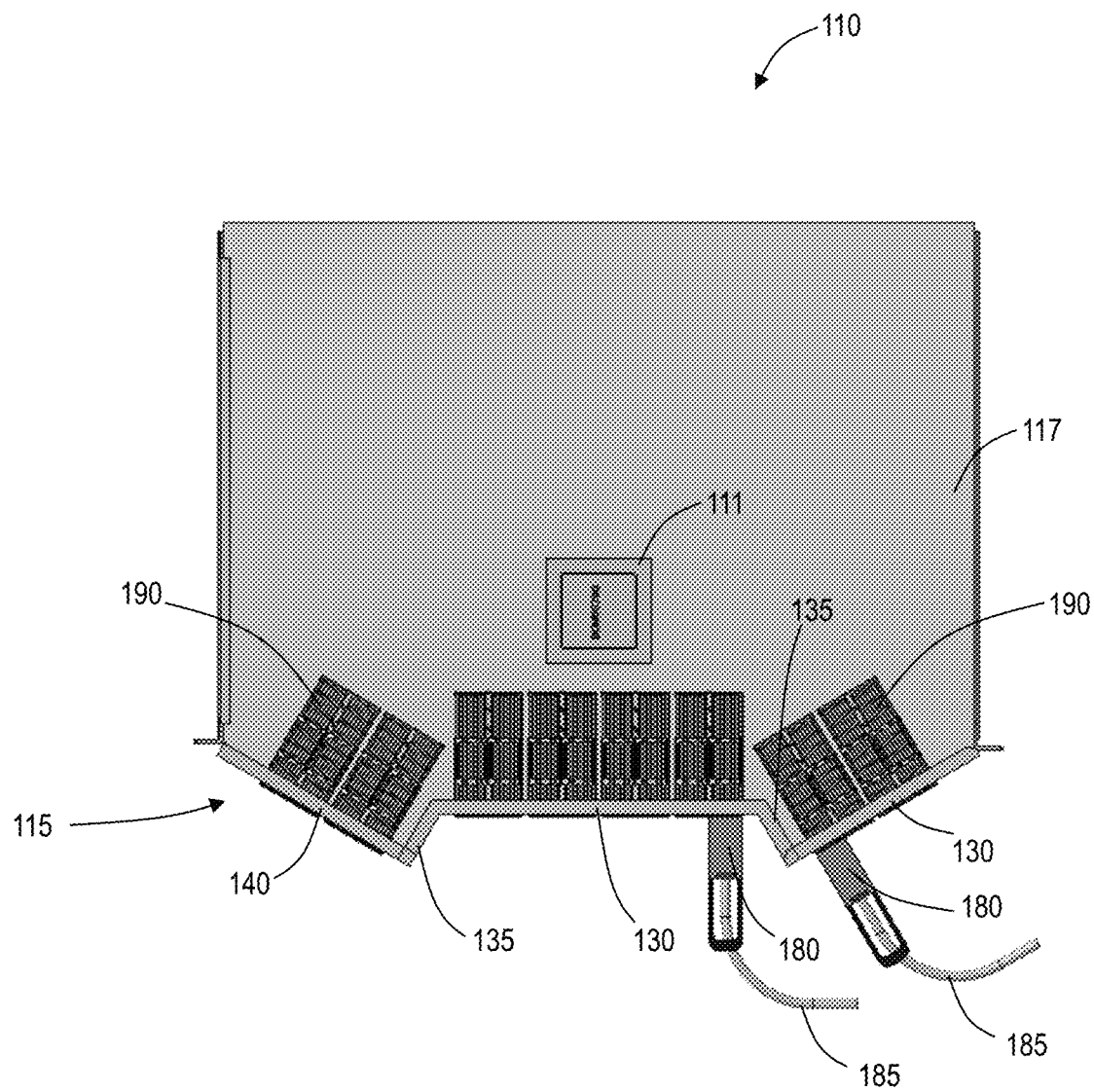
FIG. 14 is a top perspective diagram of the module for the platform of FIG. 12.

FIG. 13 is a perspective diagram of the network element 100 of FIG. 5 with a sunken middle plate 130. FIG. 14 is a top perspective diagram of the module 110 for the network element 100 of FIG. 12. Referring to FIGS. 13 and 14, in embodiments, a central flat portion of the middle plate 130, where the physical ports 114, 116 are located, is sunken into the module 110 relative to inner ends of the first and second side plates 120, 140. In these embodiments, the middle plate 130 includes stepped surfaces 135 at each side that extends out to the edges of the first and second side plates 120, 140. By so doing, the flat portion of the middle plate 130 is inset from the inner sides of the first and second side plates 120, 140. With this inset, the cages 190 of the middle plate 130 are positioned closer to the one or more circuits 111, 118 of the corresponding module 110.

In these embodiments, the handles 150 or other low-profile components of the module 110 are positioned on, embedded in, or protrude from the stepped surfaces 135.

As can be seen in FIG. 14, pluggable optics 180 are received in the physical ports 114, 116. Due to the angles of the first and second side plates 120, 140, the cables 185 of the pluggable optics can follow a shorter route to, and in cases of the pluggable optics 180 plugged into the first and second side plates 120, 140, be closer to, their destinations. Furthermore, the middle plate 130 that is sunken into the module 110 can also result in shorter routes for the cables 185. By shortening the cabling routes, DAC cables may be used instead of the more expensive AECs, which can reduce the costs of the network element 100.

Figure 15:
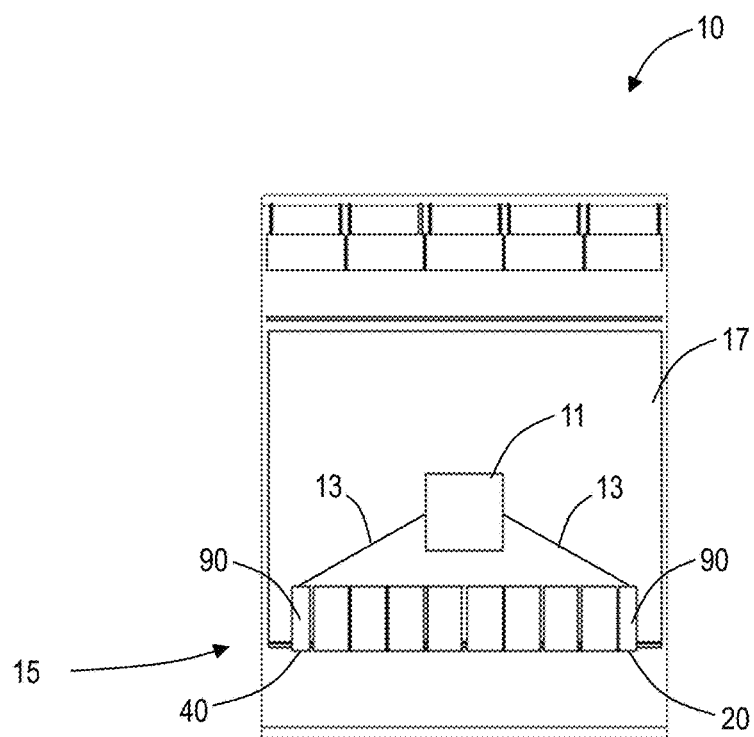
FIG. 15 is a top perspective diagram of a module for a flat faceplate.
Figures 16, 17:
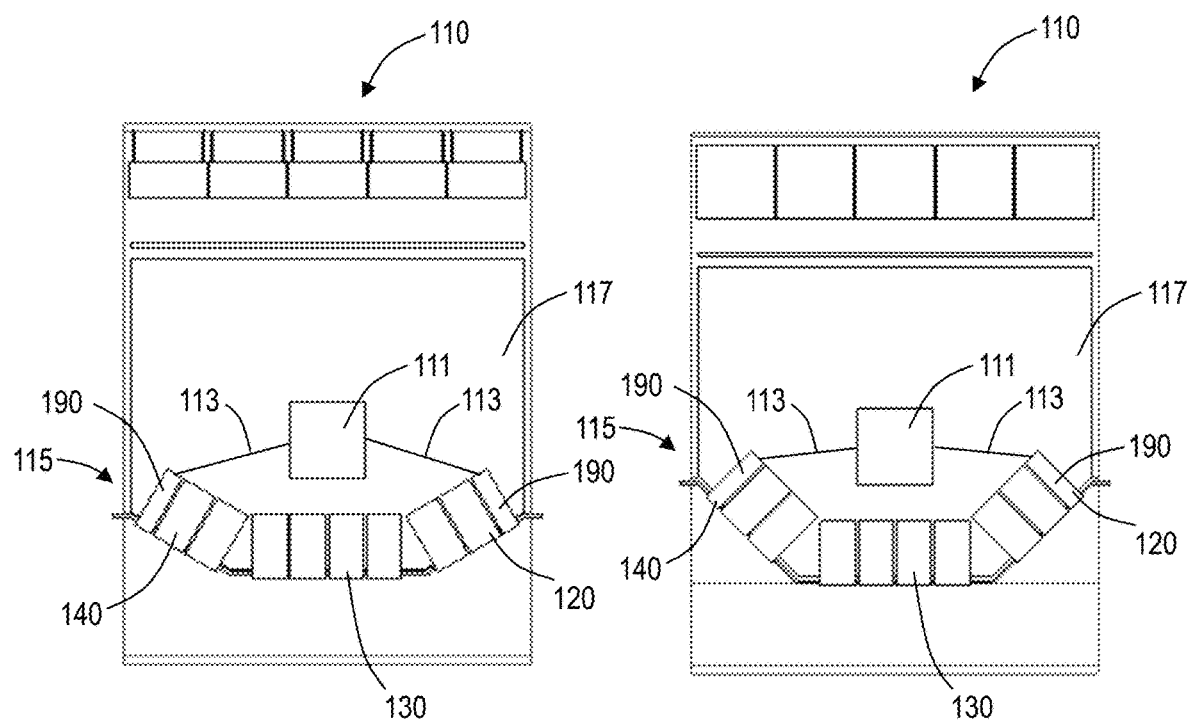
FIG. 16 is a top perspective diagram of a module with side plates at a first angle relative to the middle plate.
FIG. 17 is a top perspective diagram of a module with side plates at a second angle relative to the middle plate

FIG. 15 is a top perspective diagram of a module 10 for a flat faceplate 15. FIG. 16 is a top perspective diagram of a module 110 with side plates 120, 140 at a first angle relative to the middle plate 130. FIG. 17 is a top perspective diagram of a module 110 with side plates 120, 140 at a second angle relative to the middle plate 130. Referring to FIGS. 14-16, the shortest available track lengths 13 on the PCB 17 from the cages 90 at the sides 20 and 40 to the circuit 11 for a flat faceplate 15 of FIG. 15 are longer than the shortest available track lengths 113 from the cages 190 at the outer sides of the first and second side plates 120, 140 to the circuits 111 for the angled faceplates 115 of FIGS. 16 and 17. Referring to FIG. 14, track lengths for the cages 190 at the middle plate 130 can also be reduced with the middle plate 130 being sunken into the module 110. These reductions in track lengths can remove or reduce the need for re-timers on the PCB 117, which can reduce the cost of the module 110. Furthermore, the angled faceplate 115 can also reduce the size of the PCB 117, which can further reduce the costs associated with the module 110.

FIGS. 16-17 illustrate cages 190 and the associated track lengths 113 to the circuits 111. Also, embodiments may exclude the cages 190 and use fixed ports 114, 116 on the faceplate, i.e., optical ports integrated on the PCB 117 instead of plugs in the cages 190. That is, the cages 190 are presented for illustration purposes, and other physical implementations are contemplated with the angled faceplate.

Conventionally, the ports 114, 116 carried 10 Gbps or so in terms of traffic, and the track lengths 13 were not an issue at these rates. As is known in the art, the capacity of the ports 114, 116 (cages 190) is ever-increasing to rates of 100 Gbps, 400 Gbps, 800 Gbps and more. At these rates, the track lengths 13 are problematic, for the sides 20, 40 to the circuit 11 of the flat faceplate 15 (refer to FIG. 15). As such, the present disclosure advantageously reduces the shortest available track lengths 113 from the cages 190 at the outer sides of the first and second side plates 120, 140. Based on the need to support high-speed signals on the track lengths 113, the present disclosure contemplates the first and second side plates 120, 140 having angles of between about 30 degrees and about 45 degrees relative to the middle plate 130. In another embodiment, the present disclosure contemplates the first and second side plates 120, 140 having an angle of about 45 degrees relative to the middle plate 130. It has been determined such angles provide the proper track lengths 113 for high-speed signals (e.g., in excess of 100 Gbps).

The network element 100 can also include common equipment, power connections, and a fiber manager. The common equipment is utilized for Operations, Administration, Maintenance, and Provisioning (OAM&P) access; user interface ports; and the like. The network element 100 can include an interface for communicatively coupling the common equipment and the modules 110 therebetween. For example, the interface can be a backplane, midplane, a bus, optical or electrical connectors, or the like. The modules 110 are configured to provide ingress and egress to the network element 100.

While the example embodiments herein disclose a faceplate with plate sections including a middle plate 130, a first side plate 120, and a second side plate 140, other embodiments are also contemplated herein. Those skilled in the art that the faceplate could have two sections, including a first side plate 120 and a second side plate 140 that come together with a triangular shape with a standard or a rounded edge at the intersection thereof. Similarly, those skilled in the art will recognize that the faceplate could have more than three sections, with the first side plate 120 and the second side plate 140 being the outer two sections thereof. All such embodiments are contemplated herein, such as for reducing track lengths on the PCB and for reducing required lengths of the external cables.

Those of ordinary skill in the art will recognize the network element 100 can include other components which are omitted for illustration purposes, and that the systems and methods described herein are contemplated for use with a plurality of different network elements with the network element 100 presented as an example type of network device or hardware platform. For the high-density network element 100, other architectures providing ingress, egress, and switching therebetween are also contemplated for the systems and methods described herein. Those of ordinary skill in the art will recognize the systems and methods can be used for practically any type of network device, which includes modules 110 at a front thereof.

Also, the ports 114, 116 are referred to as fiber interface ports 114 and client connection ports 116 for functional distinction, and each of these is generally just a port. In an embodiment, the fiber interface ports 114 can be high-speed, high-bandwidth ports such as for line connections. Also, the fiber interface ports 114 can be used to support optical links to connect to other modules, such as when this is a backplane-less implementation, i.e., all ingress/egress is via the faceplate. The client connection ports 116 are similarly ports, but may be lower rate, lower-speed, lower-bandwidth relative to the fiber interface ports 114. For example, just for illustration purposes, the fiber interface ports 114 may be 100-800 G or more, whereas the client connection ports 116 may be 10-200 G.

In some embodiments, the fiber interface ports 114 can be on the middle plate 130, thereby having less track lengths 113 to the one or more circuits 111, and the client connection ports 116 can be on the first side plate 120 and the second side plate 140, thereby having slightly longer track lengths 113, relative to the fiber interface ports 114, but still reduced from conventional implementations.

In another embodiment, it is possible for all of the ports 114, 116 to be characterized as client connection ports. In this embodiment, the functionality of the fiber interface ports 114 can be replaced with a backplane.

Those skilled in the art will appreciate network elements support various port configurations, all of which are contemplated with the angled faceplate described herein, for the purposes of reduction of the track lengths 113 to support higher-speed signals.

Again, while the faceplate is described as having a middle plate, a first side plate, and a second side plate, these "plates" can be integrally formed and can be different sides of the angled faceplate.

FIGS. 18-19 are top perspective diagrams of a module 110 with multiple circuits 111 placed on the PCB 117. In FIG. 18, the circuits 111 are each disposed behind the first side plate 120 and the second side plate 140. Disadvantageously, the first side plate 120 and the second side plate 140 have to be routed to both of the circuits 111, requiring routing around circuits 111. This approach extends the track lengths 113. FIG. 19 is a perspective diagram of a module 110 with multiple circuits 111 placed on the PCB 117 that limits routing around circuits 111. Here the circuits 111 are located from front-to-back on the PCB 117 so that each of the track lengths 113 from the first side plate 120 and the second side plate 140 do not overlap.

Figure 20:
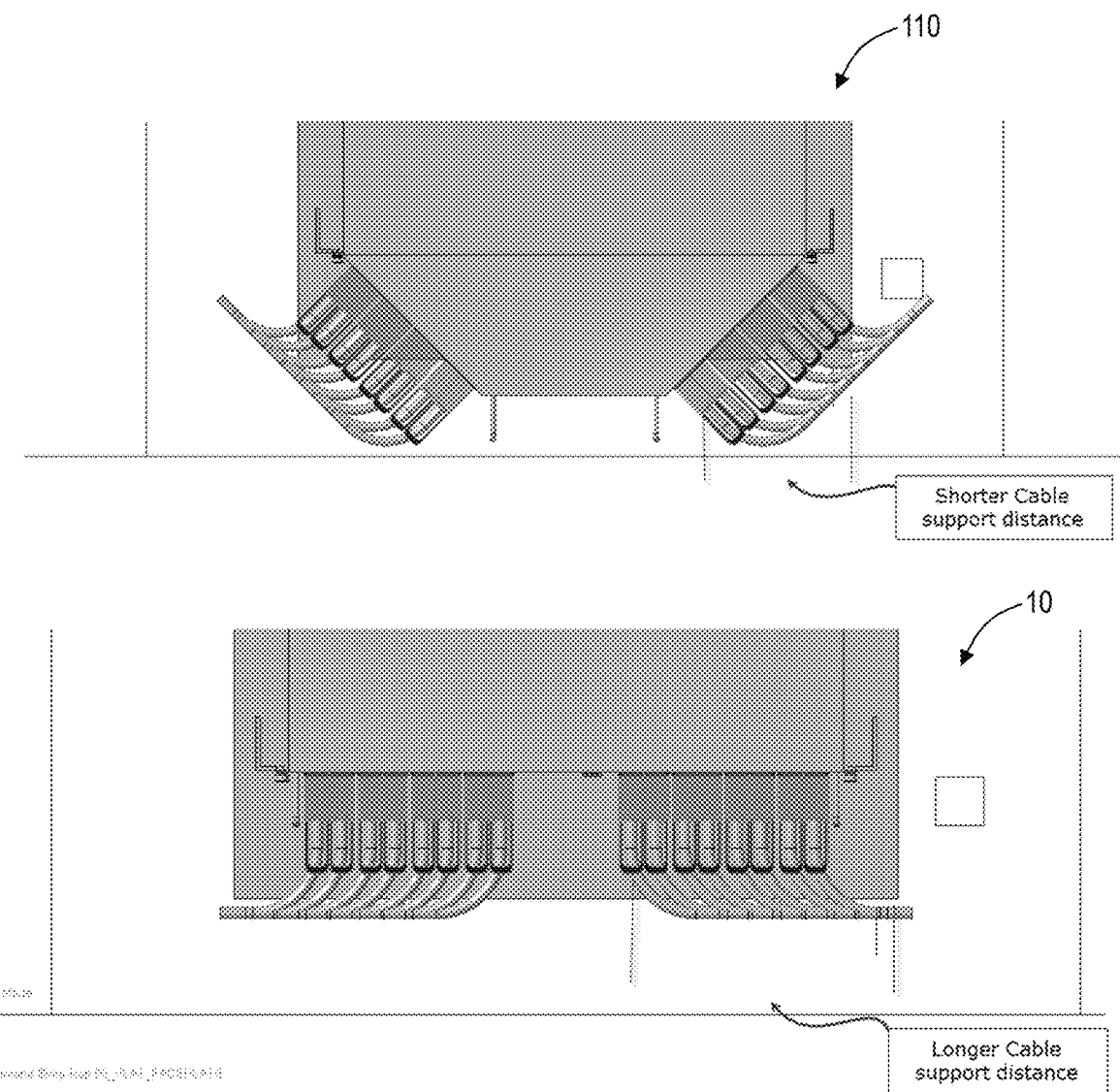
FIG. 20 is a diagram of the module compared to the module illustrating the angled faceplates of the module support shorter cable distances.

FIG. 20 is a diagram of the module 10 compared to the module 110 illustrating the angled faceplates of the module 110 support shorter cable distances. Specifically, the angles on the first side plate 120 and the second side plate 140 reduce the overall cable length required for all of the associated ports, resulting in significantly less cable lengths.

Figure 21:
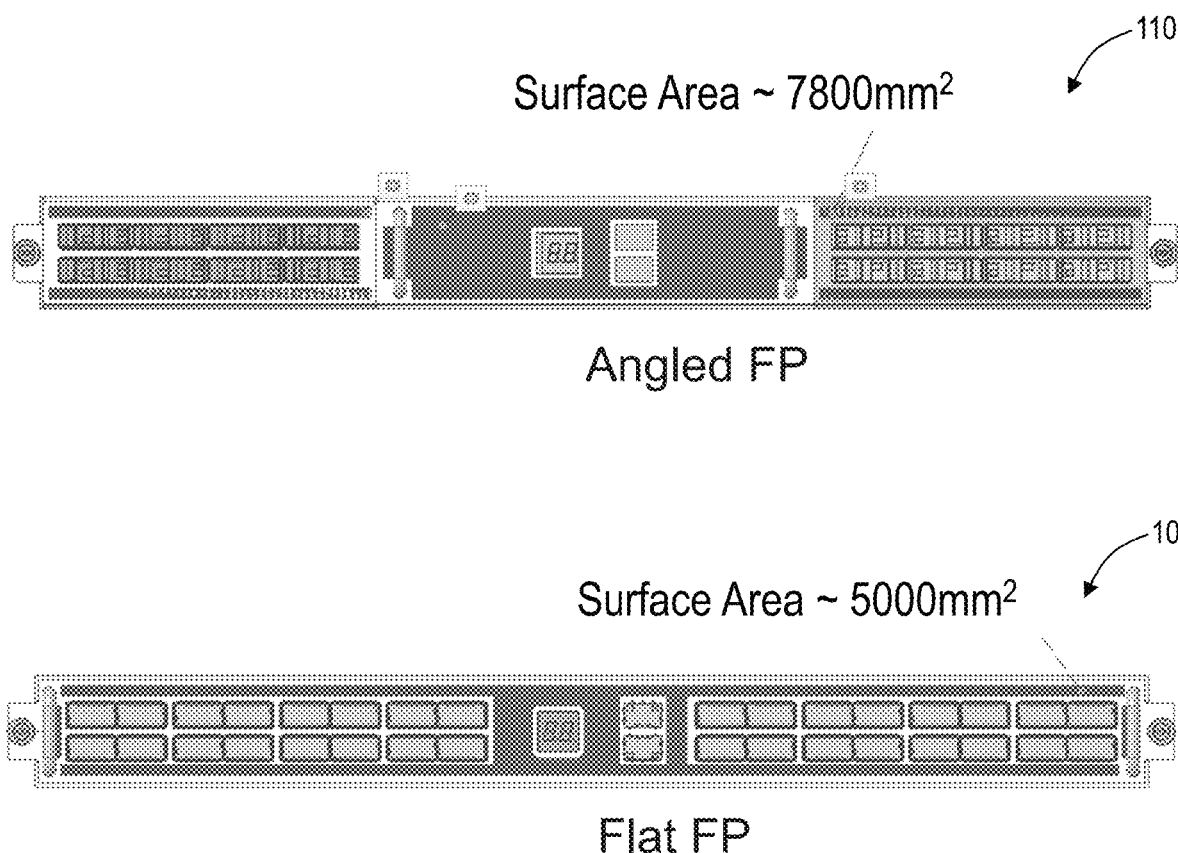
FIG. 21 is a diagram of the module compared to the module illustrating the angled faceplates of the module having increased surface area.

Another benefit of the angled faceplates includes more area on the faceplate, which provides additional space for airflow, e.g., the holes 112, and additional space for labeling, a display, Light Emitting Diodes (LEDs), etc. FIG. 21 is a diagram of the module 10 compared to the module 110 illustrating the angled faceplates of the module 110 having increased surface area. For example, assuming a 1 Rack Unit (RU) module 10, 110, in an embodiment, the 1RU module 10 can have a surface area on the faceplate of about 5000 $mm^2$ and the 1RU module 110 can have a surface area on the faceplate of about 7800 $mm^2$ such that the angled faceplate of the 1RU module 110 has more than 50% usable surface area than the 1RU module 10.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, processor, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A module for a networking node, comprising: a Printed Circuit Board ("PCB"); one or more circuits mounted to the PCB; and a faceplate including a middle plate, a first side plate extending from the middle plate at an obtuse angle relative to the middle plate towards a first side and back of the module, and a second side plate extending from the middle plate, opposite to the first side plate, at an obtuse angle relative to the middle plate towards a second side and the back of the module, wherein the one or more circuits include a circuit on the PCB positioned adjacent to the middle plate, the first side plate, and the second side plate, wherein the faceplate further includes a plurality of physical ports in each of the first side plate and the second side plate, such that the plurality of physical ports in the first side plate and the second side plate have reduced track lengths to the circuit due to the each of the first side plate and the second side plate having the obtuse angle, and such that any physical ports in the middle plate have a reduced track length to the circuit that is different from the reduced track lengths to the circuit from the plurality of physical ports in each of the first side plate and the second side plate.

2. The module of claim 1, wherein some or all of the plurality of physical ports support 100 Gbps or more in bandwidth.

3. The module of claim 1, wherein the faceplate further includes a plurality of physical ports in each of the middle plate, the first side plate, and the second side plate, and wherein the plurality of physical ports in the middle plate are one of fiber interface ports and client connection ports, and the plurality of physical ports in at least one of the first side plate and the second side plate are another of the fiber interface ports and the client connection ports.

4. The module of claim 3, wherein the fiber interface ports support more bandwidth than the client connection ports.

5. The module of claim 1, wherein the obtuse angle for each of the first side plate and the second side plate relative to the middle plate is from about 130 degrees to 160 degrees.

6. The module of claim 1, wherein the middle portion includes a flat central portion including physical ports that is sunken into the module relative to inner ends of the first side plate and the second side plate, and the middle portion also includes stepped surfaces extending from the flat central portion respectively to the first side portion and the second side portion.

7. The module of claim 1, further comprising:
one or more handles extending from the faceplate.

8. The module of claim 7, wherein the one or more handles are positioned at or adjacent to an intersection of the middle plate with at least one of the first side plate and the second side plate.

9. A node for a network, comprising:
a housing; and
a plurality of modules, the plurality of modules including at least one module comprising:
a Printed Circuit Board ("PCB"), one or more circuits mounted to the PCB, and
a faceplate including a middle plate, a first side plate extending from the middle plate at an obtuse angle relative to the middle plate towards a first side and back of the platform module, and a second side plate extending from the middle plate, opposite to the first side plate, at an obtuse angle relative to the middle plate towards a second side and the back of the module, wherein the one or more circuits include a circuit on the PCB positioned adjacent to the middle plate, the first side plate, and the second side plate, wherein the faceplate further includes a plurality of physical ports in each of the first side plate and the second side plate, such that the plurality of physical ports in the first side plate and the second side plate have reduced track lengths to the circuit due to the each of the first side plate and the second side plate having the obtuse angle, and such that any physical ports in the middle plate have a reduced track length to the circuit that is different from the reduced track lengths to the circuit from the plurality of physical ports in each of the first side plate and the second side plate.

10. The node of claim 9, wherein some or all of the plurality of physical ports support 100 Gbps or more in bandwidth.

11. The node of claim 9, wherein the faceplate further includes a plurality of physical ports in each of the middle plate, the first side plate, and the second side plate, and wherein the plurality of physical ports in the middle plate are one of fiber interface ports and client connection ports, and the plurality of physical ports in at least one of the first side plate and the second side plate are another of the fiber interface ports and the client connection ports.

12. The node of claim 9, wherein at least two of the modules of the plurality of modules include the faceplate, and wherein at least one of a configuration of physical ports, a configuration of lengths of the middle plate, the first side plate, and the second side plate, and a configuration of an angle between the middle plate and the first side plate and an angle between the middle plate and the second side plate is different between the at least two of the modules.

13. The node of claim 9, wherein at least two modules of the plurality of modules have a different shape for their associated faceplate.

14. The node of claim 9, wherein a portion of surface area of each of the first side plate and the second side plate is utilized for ventilation.

\* \* \* \* \*